United States Patent [19]

Schiller et al.

[11] Patent Number: 5,614,248
[45] Date of Patent: Mar. 25, 1997

[54] METHOD FOR PLASMA-ASSISTED REACTIVE ELECTRON BEAM VAPORIZATION

[75] Inventors: Siegfried Schiller; Manfred Neumann; Volker Kirchhoff; Gerhard Zeissig, all of Dresden; Nicolas Schiller, Helmsdorf; Klaus Goedicke, Dresden, all of Germany

[73] Assignee: Fraunhofer-Gesellschaft zur Foerderung der angewandten Forschung e.V., Munich, Germany

[21] Appl. No.: 424,418

[22] PCT Filed: Aug. 18, 1993

[86] PCT No.: PCT/DE93/00748
 § 371 Date: May 30, 1995
 § 102(e) Date: May 30, 1995

[87] PCT Pub. No.: WO94/10356
 PCT Pub. Date: May 11, 1994

[30] Foreign Application Priority Data

Oct. 27, 1992 [DE] Germany ............... 42 36 264.4

[51] Int. Cl.⁶ .............. B05D 3/06; H05H 1/02; C23C 14/00
[52] U.S. Cl. .............. 427/8; 427/566; 427/567; 427/570; 427/574; 204/192.13; 204/192.15; 204/192.16; 427/576
[58] Field of Search ................. 427/527, 529, 427/566, 567, 570, 576, 585, 596, 8, 10, 574; 204/192.1, 192.13, 192.16, 192.22, 192.23, 192.26, 192.27, 192.28, 192.29

[56] References Cited

U.S. PATENT DOCUMENTS

| | | | |
|---|---|---|---|
| 3,549,416 | 12/1970 | Rump et al. | 427/566 |
| 4,024,291 | 5/1977 | Wilmanns . | |
| 4,311,725 | 1/1982 | Holland | 427/10 |
| 4,514,437 | 4/1985 | Nath | 427/567 |
| 4,526,802 | 7/1985 | Sato | 427/579 |
| 4,676,646 | 6/1987 | Strand et al. | 427/10 |

(List continued on next page.)

OTHER PUBLICATIONS

"Closed loop control system for Web coaters with EB line evaporator"; *Proceedings of Second International Conference on Vacuum Web Coating*, by Dr. Schiller, Fort Lauderdale, Florida, Oct. 9–11, 1988, pp. 77–94.

"The Optical Monitor: A Fast, Accurate Instrument for the Measurment of Optical Thin Film Spectral Transmittance" by G. Whitehead and P. Grant, *Annual Technical Conference*, Philadelphia, 1985, pp. 109–115 no month.

*VEB Deutscher Verlag Für Grundstoffindustrie* entitled "Schichtmesstechnik" by K. Nitzsche, Leipzig, 1974, pp. 355–362 no month German–no translation.

*Primary Examiner*—Marianne Padgett
*Attorney, Agent, or Firm*—Evenson, McKeown, Edwards & Lenahan, P.L.L.C.

[57] ABSTRACT

Certain non-optical characteristics and, in particular, mechanical characteristics are not measurable in situ in the industrial production of layers using plasma-assisted reactive electron beam vaporization, particularly if high demands are made on the hardness, wear resistance and barrier action, so as to be able to reproducibly apply the layers. The values of the optical layer characteristics are to be used as a control signal. In this method, immediately after the substrate has passed through the vaporizing zone, the reflection and/or transmission and absorption capacity are measured in the wavelength range $\Delta_k$=150 to 800 nm and from this are determined the refractive index and optical absorption coefficient. These determined values are compared with an experimentally determined desired value. A control signal obtained therefrom, in the case of a constant reactive gas partial pressure, controls the plasma and maintains constant the optical characteristics of the layer. The method is used in the vapor-deposition of wear-resistance, hard layers or barrier layers, e.g. of metal oxide on glass, plastic and other materials, e.g. in the building industry for facade glass and in the packaging industry.

9 Claims, 2 Drawing Sheets

U.S. PATENT DOCUMENTS

| | | | |
|---|---|---|---|
| 4,777,062 | 10/1988 | Feuerstein | 427/567 |
| 4,837,044 | 6/1989 | Murarka et al. | 427/10 |
| 5,055,319 | 10/1991 | Bunshah et al. | 427/567 |
| 5,128,007 | 7/1992 | Matsunaga et al. | |
| 5,131,752 | 7/1992 | Yu et al. | 427/10 |
| 5,354,575 | 10/1994 | Dagenais et al. | 427/567 |
| 5,387,309 | 2/1995 | Böbel et al. | 427/8 |
| 5,403,433 | 4/1995 | Morrison et al. | 427/10 |
| 5,464,710 | 11/1995 | Yang | 204/192.27 |

METHOD FOR PLASMA-ASSISTED REACTIVE ELECTRON BEAM VAPORIZATION

BACKGROUND AND SUMMARY OF THE INVENTION

The invention relates to a method for plasmas-assisted reactive electron beam vaporization and, in particular, high rate vaporization, preferably for the production of wear-resistant, hard layers and barrier layers. Such layers consist, e.g., of metal oxides and serve as scratch and wear protecting layers on glass, plastic or other materials. They are, inter alia, used for facade glass and in the building industry. The barrier action of the layers is particularly significant in the packaging industry in order to make the material, e.g., oxygen and water vapor-impermeable. Barrier layers are also important for corrosion protection and are used in this connection.

A basic prerequisite for the production of the layer on a technical scale is to ensure constant characteristics thereof throughout the coating time. This condition makes high demands on the layer vaporization method, because generally use is made of highly productive installations with a high travel speed and large substrate surface. Under high rate coating conditions, process parameter fluctuations are unavoidable.

In the case of electron beam vaporization, it is known to monitor certain coating or layer characteristics throughout the vaporization period. Use is made for this purpose of optical characteristics, e.g. transmission and reflection, and also the electrical characteristics, such as conductivity, which can be measured in situ. It is known in this connection for the coated film, immediately following the vaporisation process, to pass through a measuring roller system. The measuring roller system determines the layer thickness distribution by measuring the electrical conductance. By regulating the residence times of the electron beam at different points of the material being vaporised, the layer thickness distribution is adjusted in a planned manner (see S. Schiller et al, *Proceedings of the 2nd Int. Conference on Vacuum Web Coating*, Fort Lauderdale, Fla. U.S.A., October 1988).

It is also known, for determining the optical characteristics, to establish the transmission and/or reflection of optical layers in the wavelength range which is of interest and to calculate therefrom the color locus or other applicative, optical characteristics. Another standard method is to determine the layer thickness in situ from the transparency or reflection (see G. Whitehead, P. Grant, "The Optical Monitor", *Proc. 28th Ann. Techn. Conf. Soc. Vac. Coaters*, Philadelphia, 1985, pp.109-115). The refractive index can be determined from the measurement of the reflection and absorption spectra. For the aforementioned fields of use of the materials or substrates to be coated, significance is attached to the mechanical characteristics such as hardness, abrasion and barrier action. Numerous measuring methods exist for measuring in a direct manner such characteristics (see K. Nitzsche, "Schichtmesstechnik", *VEB Deutscher Verlag für Grundstoffindustrie*, Leipzig, 1974). However, such methods are not suitable for in situ measurement purposes.

The mechanical characteristics are largely dependent on the internal layer structure and composition. In the case of high rate electron beam vaporization, there is no constancy of the indicated characteristics due to the inherent, complex dependence on the deposition conditions. The structure and composition of the deposited layers must therefore be measured and regulated in situ, at least in a direct manner, in order to maintain constant the requisite, mechanical characteristics.

There is therefore needed a method for plasma-assisted reactive electron beam vaporization with which it is possible to measure in situ certain non-optical layer characteristics and, in particular, mechanical characteristics, so as to be able to reproducibly apply the layers in a highly productive manner and with high a constancy. The values obtained in a known manner for the reflection and/or transmission and optical absorption at wavelengths of 150 to 800 nm must also be processed as a regulating signal. The method must in particular be suitable for continuous flow units for producing wear-resistant, hard layers or layers having a barrier action. Measured quantities are to be found which can be non-destructively determined in situ. For process control purposes, use is to be made of suitable and, optionally, also known regulating and control possibilities.

According to the present invention, these needs are met by a method for plasma-assisted reactive electron beam coating by vaporization of substrates with hard, wear-resistant layers and/or layers with barrier characteristics by producing a controllable plasma in the process zone between the vaporizing material and the substrate to be coated and the in situ measurement of optical characteristics. Immediately after the substrate has passed through the vaporizing zone, the reflection and/or transmission and the absorption capacity are measured in the wavelength range $\Delta_k$ 150 nm to 800 nm. From this measurement, the refractive index n and the optical absorption coefficient k are separately determined. These values are compared with an experimentally determined desired value. With the control signal obtained therefrom, and in the case of a constant reactive gas partial pressure, the parameters of the plasma are controlled in such a manner that the initially measured optical characteristics of the vapor-deposited layer are kept constant.

It has surprisingly been found that certain non-optical characteristics, such as, e.g., the hardness, abrasion and barrier action of layers correlate with certain optical characteristics, such as absorption, reflection and transmission. Clearly, this dependence is due to the fact that changes in the packing density, the chemical composition and the binding states act in the same direction in mechanical and barrier characteristics and also in optical characteristics. It has been found that the tolerance limits of the mechanical and barrier characteristics are always respected if the optical characteristics are kept constant within certain tolerance limits. For this purpose, the refractive index n and absorption coefficient k are monitored. It has also been found that in the case of such plasma-assisted reactive processes apart from many other parameters, which must be experimentally determined and kept constant, the reactive gas partial pressures and plasma parameters have a considerable influence on these characteristics. An important part, in connection with the layer formation process, is played by the reactivity and formation enthalpy of the chemical compound, as well as the dissociation capacity in the case of electron beam vaporization. It is fundamentally possible to regulate the reactive gas partial pressure or plasma parameters as a function of the in situ measured values n and k in order to obtain the layer characteristics. It has been found that the effectiveness of the selected regulating or control process is dependent on the layer system. Thus, e.g., when depositing $SiO_x$ layers, a regulation of the partial pressure of the reactive gas is particularly effective for obtaining constant barrier characteristics. However, in the deposition of aluminum oxide, the regulation of the plasma parameters has proved advantageous in order to ensure the necessary mechanical properties, such as hardness and abrasion.

The determination of the refractive index n and the absorption coefficient k is, however, not technically possible in the vicinity of the plasma area and therefore in a direct manner during layer formation in the case of high rate vaporization. This naturally leads to a time lag between layer formation and the determination of n and k. Thus, as a result of this time lag, a given basic stability of the entire vaporization process is necessary in order to ensure that the layer characteristics do not exceed the requisite tolerances. The necessary plasma excitation can take place in a known manner inter alia by ion sources or by electron impact-determined low pressure plasmas. The prerequisite for an effective control of the reactive gas partial pressure is the keeping constant of the plasma excitation during the coating process. Various control methods are known for keeping the plasma parameters constant and are based on the measurement of the plasma parameters, e.g. by means of probes or optical emission spectroscopy. For solving the present problem, the measurement of the optical plasma emission has proved particularly advantageous.

When regulating the plasma parameters as a function of n and k, the reactive gas partial pressure must be kept constant. For this, it is possible to regulate the reactive gas flow or the suction capacity of the pumps as a function of the reactive gas partial pressure.

Other objects, advantages and novel features of the present invention will become apparent from the following detailed description of the invention when considered in conjunction with the accompanying drawings.

DETAILED DESCRIPTION OF THE INVENTION

Figure 1:
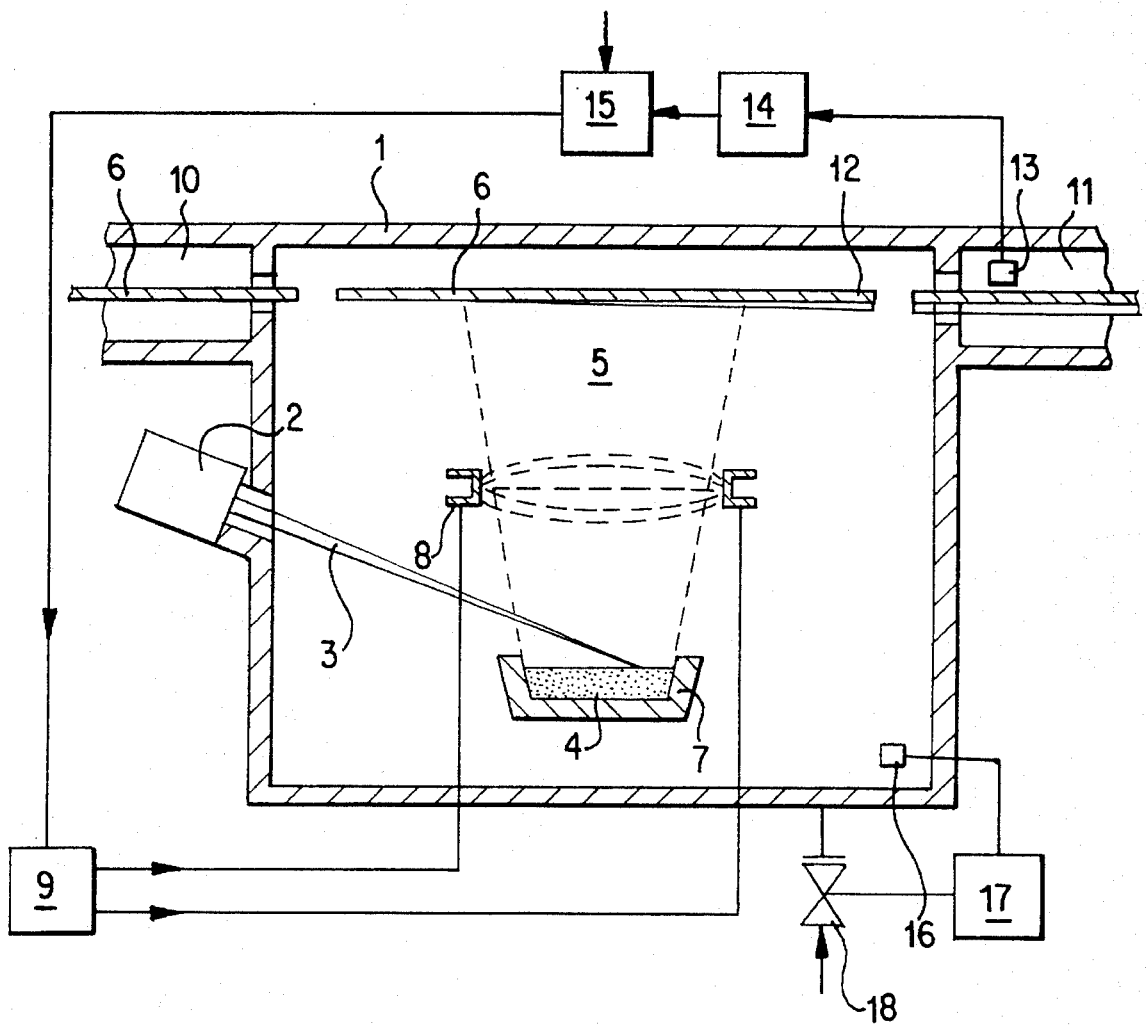
FIG. 1 is a schematic diagram of an electron beam vaporizer for coating plate-like substrates.

An axial electron gun 2 with a beam guidance system is attached to the vaporizing chamber 1 via a flange. The electron beam 3 produced with the electron gun 2 strikes the surface of a vaporization material 4 accompanied by a programmed deflection and produces a high vapor pressure in a process zone 5 (vaporization zone) between the surface of the material 4 and a plate-like substrate 6 to be coated by the vaporization and positioned above the material 4.

The capacity of the electron gun 2 is 40 to 50 kW. The vaporization material 4 located in a vaporizing crucible 7 is constituted by an aluminium oxide ($Al_2O_3$). A plasma source 8 is located between the vaporizing crucible 7 and the substrate 6 and is used for vapor excitation. The plasma source 8 is controlled by a plasma generator 9. The conveying speed of the substrate is approximately 1 m/s. The substrate movement takes place via the inlet lock 10 through the vaporizing chamber 1 to the measuring chamber 11 from which the substrates 6 are discharged again in known manner.

The object of the vaporizing process is the deposition of a layer 12 on the substrate 6 with a "static" deposition rate of 0.5 μm/s. The layer 12 must have a high hardness and abrasion resistance. In technical operation without process control, it is unavoidable that numerous disturbance variables will lead to instabilities of the process and therefore to the divergence of the layer characteristics from the sought parameters for the layer 12. Such disturbance variables are the vaporization process itself, the stability of plasma excitation, and the influencing of the vapor during propagation in the process zone 5. The disturbances have not been completely explained and largely cannot be influenced. In the present aluminium oxide vaporization process, e.g., local craters occur on the surface of the vaporization material 4. Violent gas escapes are also observed during the dissociation of the vaporization material 4, which lead to vapor propagation problems. The coating of the complete process zone, as well as the plasma source 8 located therein, cannot be avoided and leads to long-term drifts of different, not separately determinable vaporizing parameters and, therefore, to undesired changes in the layer characteristics.

The method according to the present invention aimed at producing layers with constant mechanical characteristics, such as hardness and abrasion, is performed with the apparatus described hereinafter. Using a sensor 13 located in the measuring chamber 11, the transmission spectra of the layer 12 are recorded in a wavelength range of 200 to 800 nm. In a known evaluating unit 14, the absorption coefficient k and refractive index n are determined from the measured spectra and the mechanical hardness and abrasion resistance are derived from the previously experimentally determined connections. These values are supplied to a controller 15 and are compared with predetermined desired values therein using systems known per se. The desired values have been determined experimentally and represent the requisite abrasion resistance and hardness of the vapor-deposited aluminium oxide layer 12 on the substrate 6. On the basis of the comparison of these values, a control signal is formed and passed to the plasma generator 9. The generator 9, as a function of the control signal, influences the plasma source 8 for modifying the plasma parameters.

In the case of a spacing of 3 m between the center of the process zone 5 and the sensor 13 in the measuring chamber 11, and a conveying speed of 1 m/s, there is a time lag of approximately 3 s between layer deposition and the measurement of the characteristics. This arrangement requires a basic stability of the coating process over periods greater than 3 s. To achieve this, use is made of a further sensor 16 and a partial pressure regulator 17 to keep constant the reactive gas partial pressure over the gas inlet 18. When using this method, under the given process conditions, tolerances for the hardness of ±10% and for the abrasion of ±20% are obtained.

Figure 2:
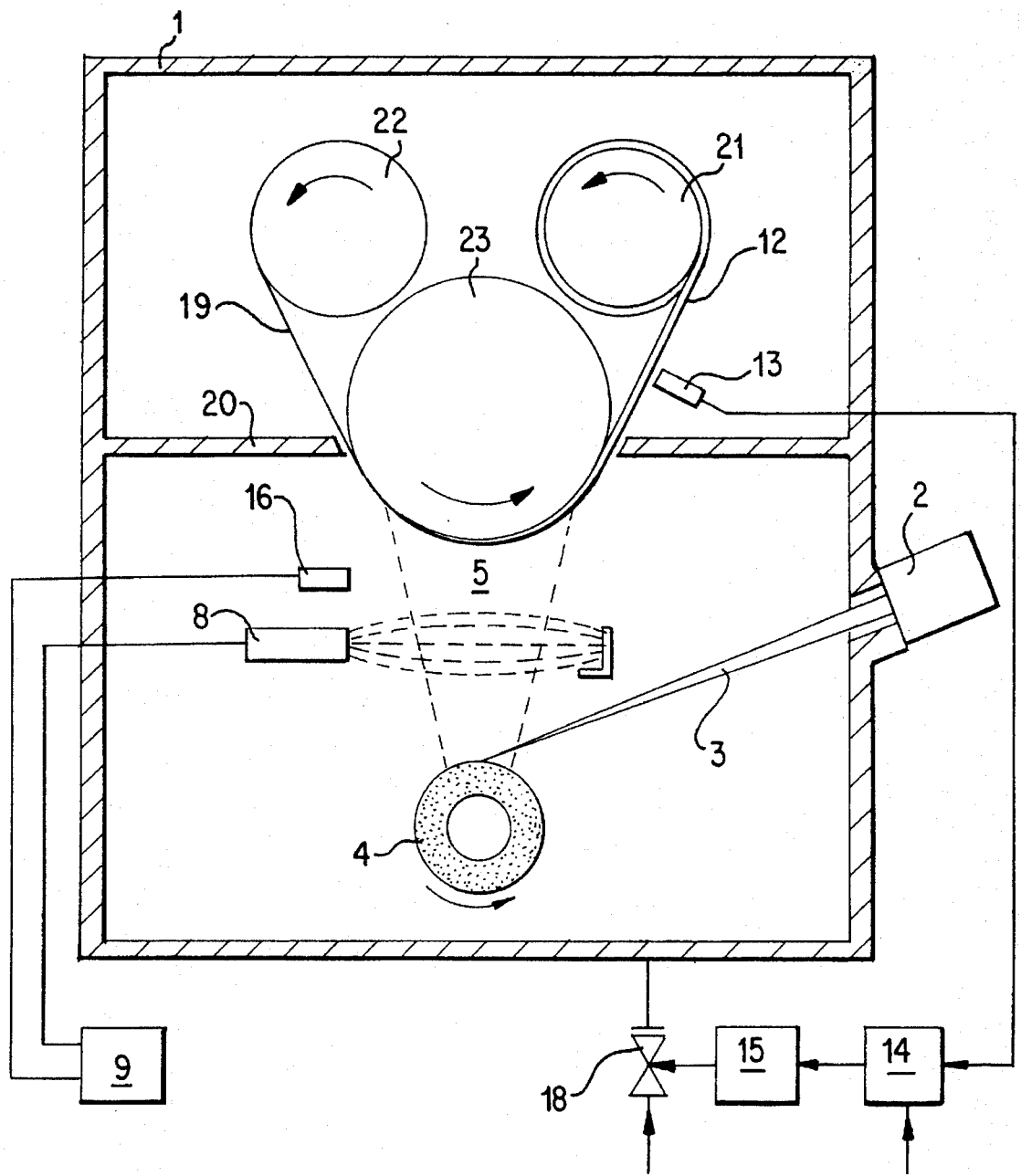
FIG. 2 is a schematic diagram of an electron beam vaporizer for coating plastic films.

The apparatus according to FIG. 2 is used for coating films 19 by vaporization, such as polyester films. Vaporization takes place according to the known "internal" passage principle, the apparatus being a batch unit. Located in the upper part of the vaporizing chamber 1 in a known manner and separated by a partition 20 are the wind-in device 21 and wind-off device 22 for the film 19. The film 19 runs over a cooling roller 23. Attached via a flange to the vaporizing chamber 1 is the electron gun 2, whose electron beam 3 is deflected in a programmed manner onto the vaporizing material 4. The vaporizing material 4 is a tube of silicon dioxide ($SiO_2$) which is constantly rotated about its longitudinal axis. The capacity of the electron gun 2 is between 25 and 30 kW. The plasma source 8 is located between vaporizing material 4 and the film 19 and is used for exciting the vapor. The plasma source 8 is controlled using the plasma generator 9. The conveying speed of the film 19 is 4 m/s. The movement of the film 19 from the wind-off device 22 takes place through the process zone 5 to the wind-on device 21. The goal of the electron beam vaporization is to deposit a SiO$_x$ layer 12 on the film 19 with a static deposition rate of 800 nm/s. The layer 12 must have high barrier characteristics for oxygen and water vapor. During the vaporization process, similar instabilities occur to those described in conjunction with the first embodiment of FIG. 1.

Using this apparatus, the method of the present invention is performed in the following manner. Using the sensor 13 in the upper part of the vacuum chamber 1 in the vicinity of the coated film 19, the reflection spectra of the layer 12 are recorded in a wavelength range of 180 to 600 nm. In the evaluation unit 14, the absorption coefficient k and refractive index n are determined from the measured spectra and the barrier characteristic of the layer 12 is derived therefrom. The determined value is supplied to the controller 15 and compared herein with the desired value. The desired value has been established experimentally and represents the requisite barrier characteristic of the vapor-deposited silicon dioxide layer 12 on the film 19. From a comparison of these values, a control signal is formed which controls the reactive gas flow via the gas inlet 18. The reactive gas partial pressure is influenced as a function of this control signal. In the case of a spacing of approximately 1 m between the process zone 5 and the area in which the sensor 13 is located, there is a time lag between layer deposition and the measurement of characteristics of approximately 250 ms. This arrangement requires a basic stability of the coating process of >250 ms. In order to achieve this, with a further sensor 16 located in the vicinity of the plasma source 8, the intensity of the excited plasma is measured and with the aid of the plasma generator 9 and the integrated controller is kept constant in a known manner. Under the given process conditions, the use of this method leads to an improvement of the barrier characteristic of a factor of 100 in a reproducible manner compared with the uncoated film 9.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A method for coating a substrate with a layer having defined mechanical characteristics by plasma-assisted reactive electron beam vaporization producing a controllable plasma in a process zone between a vaporizing material and the substrate so as to deposit a coating layer on said substrate, and providing in situ measurement of optical characteristics of the coating layer deposited on the substrate, the method comprising the steps of:

experimentally determining a correlation between optical characteristics and mechanical characteristics of the coating layer;

measuring in a wavelength range $\Delta_k$=150 nm to 800 nm at least one of a reflection, transmission and absorption capacity of the coating layer on the substrate immediately after the substrate passes through a vaporizing zone;

separately determining from said measuring step a refractive index n and an optical absorption coefficient k;

deriving initial mechanical characteristics of the coating layer corresponding to said index n and said coefficient k;

comparing said derived initial mechanical characteristics with the defined mechanical characteristics to obtain a control signal; and using the control signal to control operating parameters of the plasma in a case of a constant reactive gas partial pressure in such a manner that said measured optical characteristics of the coating layer are maintained constant to achieve the defined mechanical characteristics, and in a case of constant plasma parameters, using the control signal to control the reactive gas partial pressure in such a manner that the measured optical characteristics of the coating layer are kept constant to achieve the defined mechanical characteristics.

2. Method according to claim 1, wherein for ensuring a fundamental stability of a plasma generating source, an intensity of a plasma emission in the process zone is measured and an operation of the plasma generating source is regulated by regulating one of an electric power and gas flow.

3. Method according to claim 1, wherein the reactive gas partial pressure is regulated by regulating a reactive gas flow.

4. Method according to claim 1, wherein the reactive gas partial pressure is regulated by regulating a suction capacity of a vacuum pump.

5. A method according to claim 1, wherein the mechanical characteristics are related to at least one of a hardness, a wear-resistance, and a barrier action of said coating layer.

6. A method according to claim 1, further comprising the step of using one of a glass material and a plastic material as said substrate.

7. A method according to claim 1, further comprising the step of operating said plasma-assisted reactive electron beam vaporization at a coating rate of 0.5 μm/s.

8. A method according to claim 1, further comprising the step of operating said plasma-assisted reactive electron beam vaporization at a coating rate of about 800 nm/s.

9. A method for coating a substrate with a wear-resistant layer and/or a layer with barrier characteristics by plasma-assisted reactive electron beam vaporization producing a controllable plasma in a process zone between a vaporizing material and the substrate to be coated, and providing in situ measurement of optical characteristics of the coating layer deposited on the substrate, the method comprising the steps of:

measuring in a wavelength range $\Delta_k$=150 nm to 800 nm at least one of a reflection, transmission and absorption capacity of the coating layer on the substrate immediately after the substrate passes through a vaporizing zone;

separately determining from said measuring step a refractive index n and an optical absorption coefficient k;

comparing said values n and k with an experimentally determined value corresponding to a predetermined wear-resistant layer and/or a predetermined layer with barrier characteristics to obtain a control signal; and using the control signal to control operating parameters of the plasma in a case of a constant reactive gas partial pressure in such a manner that said measured optical characteristics of the coating layer are maintained constant, and in a case of constant plasma parameters, using the control signal to control the reactive gas partial pressure in such a manner that the measured optical characteristics of the coating layer are kept constant.

\* \* \* \* \*